United States Patent
Schreiber et al.

(10) Patent No.: US 11,929,114 B2
(45) Date of Patent: Mar. 12, 2024

(54) RAPID TAG INVALIDATION CIRCUIT

(71) Applicant: Advanced Micro Devices, Inc., Santa Clara, CA (US)

(72) Inventors: Russell Schreiber, Austin, TX (US); Kyle David Whittle, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 208 days.

(21) Appl. No.: 17/564,680

(22) Filed: Dec. 29, 2021

(65) Prior Publication Data
US 2023/0206995 A1 Jun. 29, 2023

(51) Int. Cl.
| G11C 11/4074 | (2006.01) |
| G11C 11/4076 | (2006.01) |
| G11C 11/408 | (2006.01) |
| G11C 11/4094 | (2006.01) |
| G11C 11/4096 | (2006.01) |
| G11C 11/4099 | (2006.01) |

(52) U.S. Cl.
CPC ...... *G11C 11/4099* (2013.01); *G11C 11/4074* (2013.01); *G11C 11/4076* (2013.01); *G11C 11/4085* (2013.01); *G11C 11/4094* (2013.01); *G11C 11/4096* (2013.01)

(58) Field of Classification Search
CPC ............ G11C 11/4099; G11C 11/4074; G11C 11/4076; G11C 11/4085; G11C 11/4094; G11C 11/4096
USPC ...................................................... 365/230.03
See application file for complete search history.

(56) References Cited

U.S. PATENT DOCUMENTS

| 7,358,764 | B1 | 4/2008 | Chan et al. |
| 10,037,290 | B1* | 7/2018 | Lee ......................... G11C 8/16 |
| 2006/0028540 | A1 | 12/2006 | Ohbayashi et al. |
| 2013/0322193 | A1* | 12/2013 | Sahu ..................... G11C 11/418 |
| | | | 365/194 |
| 2015/0036418 | A1 | 2/2015 | Chai et al. |
| 2021/0193236 | A1* | 6/2021 | Cai ......................... G11C 5/147 |

OTHER PUBLICATIONS

International Search Report and Written Opinion for PCT/US2022/053520, dated May 9, 2023.

* cited by examiner

*Primary Examiner* — Ly D Pham
(74) *Attorney, Agent, or Firm* — Kowert, Hood, Munyon, Rankin & Goetzel, P.C.; Rory D. Rankin (57) ABSTRACT

A system and method for efficiently resetting data stored in a memory array are described. In various implementations, an integrated circuit includes a memory for storing data, and a processing unit that generates access requests for the data stored in the memory. When access circuitry of the memory array begins a reset operation, it reduces a power supply voltage level used by memory bit cells in a column of the array to a value less than a threshold voltage of transistors. Therefore, the p-type transistors of the bit cells do not contend with the write driver during a write operation. The access circuitry provides the reset data on the write bit lines, and asserts each of the write word lines of the memory array. To complete the write operation, the access circuitry returns the power supply voltage level from below the threshold voltage level to an operating voltage level.

20 Claims, 8 Drawing Sheets

RAPID TAG INVALIDATION CIRCUIT

BACKGROUND

Description of the Relevant Art

Generally speaking, a variety of semiconductor chips use a memory for storing data, and a processing unit that generates access requests for the data stored in the memory. The memory includes both a memory array of many bit cells and access circuitry used for accessing values stored in the array. An example of the memory array is a tag array of a cache of one of the multiple levels of a cache memory subsystem. For semiconductor chips with multiple processing units, the demand for memory increases. A larger amount of memory provides both sufficient storage for each processing unit and sharing of more information across the multiple processing units. In some designs, the processing unit and the memory are on a same die such as a system-on-a-chip (SOC). In other designs, the processing unit and the memory are on different dies within a same package such as a system-on-a-package (SIP).

Static random access memory (SRAM) is commonly used for the memory array. In order to balance performance and power consumption, the memory array is reset at times. Examples of resetting the memory array are invalidating a cache between a transition from a sleep state and to an active state, invalidating a cache to push new content to a client, invalidating a cache to change cache size, and so on. Resetting the memory array quickly increases performance. However, updating a large number of entries concurrently causes the write drivers of the access circuitry to increase significantly in size. Therefore, there are costs with increased power consumption and increased on-die area.

In view of the above, efficient methods and systems for efficiently resetting data stored in a memory array are desired.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently resetting data stored in a memory array are contemplated. In various implementations, an integrated circuit includes a memory for storing data, and a processing unit that generates access requests for the data stored in the memory. The memory includes both a memory array of many bit cells and access circuitry used for accessing values stored in the array. In various implementations, the memory array is implemented with SRAM. An example of the memory array is a tag array of a cache of one of the multiple levels of a cache memory subsystem. The memory array (or array) utilizes memory bit cells arranged as multiple rows and multiple columns.

Prior to a reset operation, the access circuitry of the memory array generates a power supply reference voltage level of the array on a power supply connection used by memory bit cells of a column of the multiple columns. In various implementations, p-type devices (transistors) of back-to-back inverters of an SRAM bit cell receive the power supply reference voltage level. However, when the access circuitry receives an indication of the reset operation, the access circuitry generates, on the power supply connection, a voltage level that is less than a threshold voltage of transistors used in the memory bit cell. Therefore, the p-type devices are turned off and do not contend with the write driver during a write operation. In some implementations, the access circuitry generates the ground reference voltage level on the power connection.

The access circuitry also generates the reset values on the write data lines. In an implementation, the reset data values indicate an invalid cache line. When the power connection is updated and the write data is provided on the write bit lines, the access circuitry asserts each of the write word lines of the memory array. Therefore, for a particular column of the memory array, each of the multiple rows has stored data concurrently updated to the reset values on the write data lines. In some implementations, the access circuitry concurrently asserts each of the write word lines corresponding to each of the multiple rows of the memory array. In another implementation, the access circuitry asserts the multiple write word lines in stages in order to reduce voltage droop caused by the simultaneous switching of a wide bus. Similarly, when the memory array uses multiple column select lines, in an implementation, the access circuitry concurrently asserts the multiple column select lines. In another implementation, the access circuitry asserts the multiple column select lines in stages.

When the write word lines and any column select lines are asserted, the write operation begins due to the pass gates and the n-type devices in the SRAM bit cells. However, the write operation does not complete while the p-type devices remain disabled. The powers supply voltage level of the bit cells returns to an operating value above the device threshold voltage level from the reset value that is less than the device threshold voltage level. The write operation is able to complete without the p-type devices contending with the write driver of the access circuitry. Therefore, both the latency and the power consumption of the write operation during reset reduces. When the write operation completes, which ends the reset operation, the access circuitry reverses the above steps to prepare the memory array for generated access requests from the processing unit.

Figure 1:
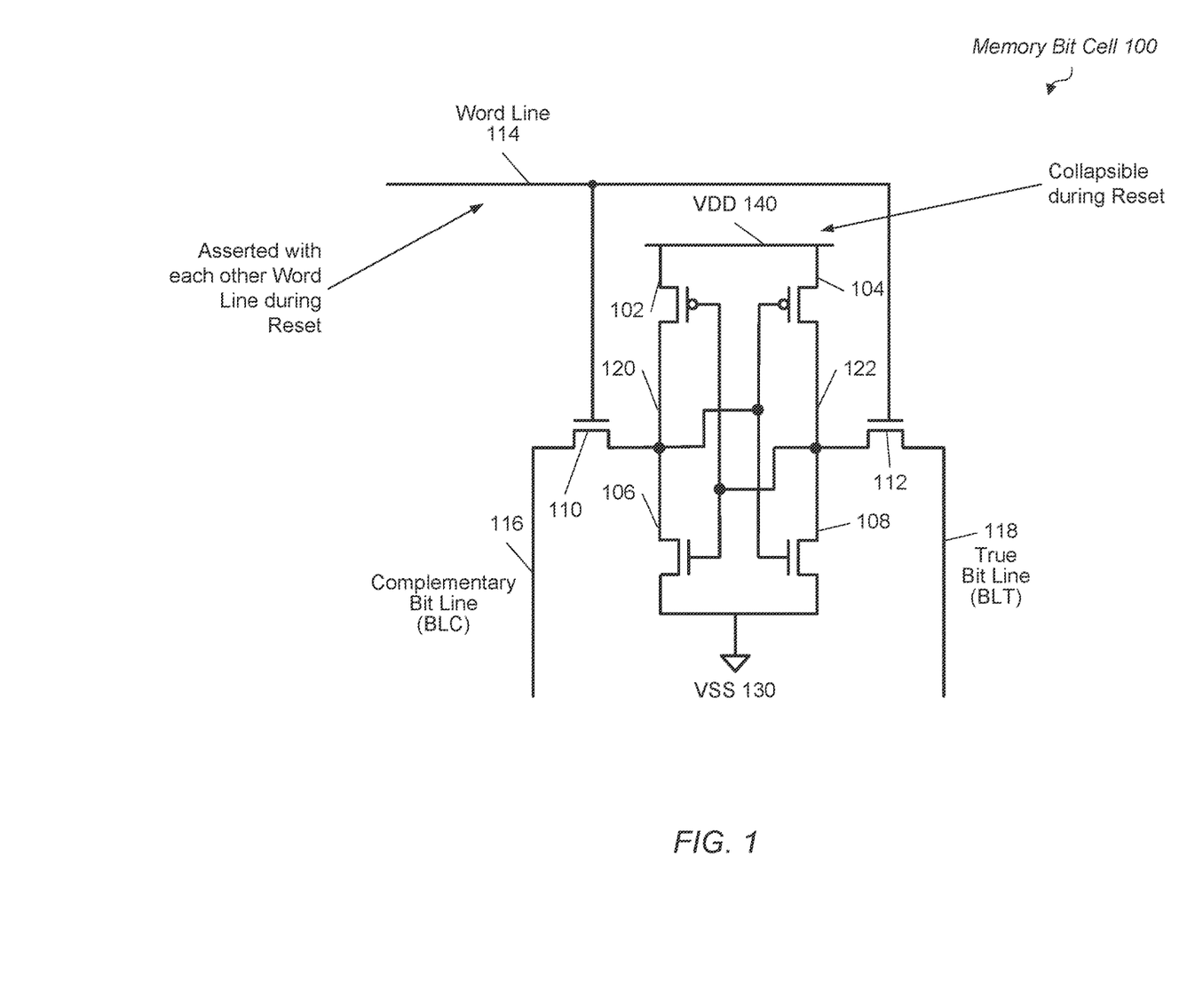
FIG. 1 is a generalized diagram of a memory bit cell.

Turning now to FIG. 1, a generalized diagram is shown of a memory bit cell 100. As shown, data storage is provided by the memory bit cell 100, which uses a variation of the six-transistor (6T) static random access memory (SRAM) cell. In other implementations, another one of various types of RAM cells is used. In an implementation, the memory bit cell 100 is copied many times and arranged in an array of rows and columns for a memory. The memory also includes access circuitry, which is not shown here for ease of illustration. However, a further description of the access circuitry is provided in the discussion directed toward the access circuitry 300 (of FIG. 3) and the memory bank 600 (of FIG. 6). The access circuitry uses multiple components to generate voltage levels on the word line 114, the data lines 116 and 118, and the power supply voltage reference VDD 140. Examples of these components are row decoders, column decoders, a sense amplifier, and latches for storing read data and write data.

The memory bit cell 100 utilizes both p-type and n-type MOSFETs (metal oxide semiconductor field effect transistors). As used herein, the MOSFETs are also referred to as transistors and as devices. The terms "transistors" and "devices" are used interchangeably in the following description. An n-type transistor or an n-type device is an NMOS-FET. Similarly, a p-type transistor or a p-type device is a PMOSFET. As used herein, a Boolean logic high level is also referred to as a logic high level. Similarly, a Boolean logic low level is also referred to as a logic low level. In various implementations, the logic high level is equal to a power supply reference level and the logic low level is equal to a ground reference level. As used herein, a circuit node or line is "asserted" when the node or line stores a voltage level that enables a transistor that receives the voltage level, or the voltage level indicates an operation is enabled. For example, an n-type transistor is enabled when the n-type transistor receives a positive non-zero voltage level on its gate terminal that is at least a threshold voltage above a voltage level on its source terminal.

As used herein, the circuit node or line is "negated" when the node or line stores a voltage level that disables a transistor that receives the voltage level. An n-type transistor is disabled when the n-type transistor receives a voltage level on its gate terminal that is a threshold voltage below a voltage level on its source terminal. Similarly, a p-type transistor is enabled when the p-type transistor receives a voltage level on its gate terminal that is at least a threshold voltage below a voltage level on its source terminal. The p-type transistor is negated when the p-type transistor receives a voltage level on its gate terminal that is at least a threshold voltage above a voltage level on its source terminal.

The memory bit cell 100 (or bit cell 100) uses a latching element that is implemented by the p-type transistors 102-104 and n-type transistors 106-108. The bit cell 100 also uses pass gates implemented with n-type transistors 110 and 112. When the pass gates 110 and 112 are enabled by the word line input 114, the latching element has access to the data bit lines 116 and 118. When the transistors 102-108 of the latching element resolve the voltage level (data value) on the output nodes 120 and 122, which are drain terminals, the transistors 102-108 do not consume power besides leakage current power.

The data stored by the transistors 102-108 of the latching element is gated from the bit lines 116 and 118 by the n-type transistors 110 and 112. The n-type transistors 110 and 112 continue to block the stored data from the bit lines 116 and 118 until the word line input 114 is enabled by external access circuitry. The external access circuitry also pre-charges the bit lines 116 and 118. The transistors 102-108 of the latching element amplify any voltage difference detected between the differential voltages on the bit lines 116 and 118 and resolve these voltages to full swing voltage values. The bit lines 116 and 118 are routed throughout a respective column of the array. In some implementations, the bit lines 116 and 118 are also inputs to a sense amplifier (not shown) and read latches (not shown). In other implementations, the bit lines 116 and 118 are inputs to dynamic logic.

The word line 114 is used to enable the n-type transistors 110 and 112 (pass gates 110 and 112). The word line 114 is also connected to other 6T RAM cells of other bit cells in a corresponding row of the array. Typically, a row decoder (not shown) asserts a single word line at a time of the multiple word lines. For example, the row decoder receives address information used to identify a single row of the multiple rows of the array. Once identified, the row decoder asserts the corresponding single word line of the multiple word lines. When the address information indicates the word line 114 is the selected word line to be asserted, the n-type transistors 110 and 112 of each 6T RAM cell in the row are enabled and provide access for the transistors 102-108 of the latching element to the bit lines 116 and 118. During a reset operation, though, multiple word lines are asserted concurrently. Further details of the reset operation are provided shortly in the below description.

For read access operations, the external sense amplifier is enabled, the external read latches are enabled, and external pre-charge transistors are disabled. Therefore, the transistors 102-108 of the latching element are permitted to resolve the differential voltages on the bit lines 116 and 118 to full voltage swing values. For write access operations, a column decoder selects columns of the array, and drives voltage levels onto the bit lines 116 and 118 routed throughout a selected column in addition to disabling external pre-charge signals. Although the memory bit cell 100 is shown as a single ported cell, in other implementations, the memory bit cell 100 uses a multi-port design to provide parallel access operations for improved performance.

There are a variety of reasons for resetting the memory array that uses bit cell 100. In some designs, the memory array is a tag array of a cache of one of the multiple levels of a cache memory subsystem. Examples of reasons for performing a reset are invalidating a cache between a transition from a sleep state and to an active state, invalidating a cache to push new content to a client, invalidating a cache to change cache size, and so on. Prior to the reset operation, the external access circuitry generates the power supply reference voltage VDD 140 as a positive, non-zero voltage level greater than a transistor threshold voltage level. In various implementations, each bit cell of at least one column of the multiple columns of the array shares VDD 140. The bit cell 100 is included in this column. However, when the access circuitry receives an indication of the reset operation, the access circuitry generates a voltage level on VDD 140 that is less than the transistor threshold voltage level. In some implementations, the access circuitry generates the ground reference voltage level, such as VSS 130, on VDD 140. Therefore, the p-type devices 102 and 104 are disabled. By being disabled, the p-type devices 102 and 104 do not contend with the external write driver during a later write operation. In various implementations, each bit cell of the at least one column of the multiple columns that includes bit cell 100 has similar p-type devices disabled.

When the access circuitry provides a voltage level on VDD 140 that turns off the p-type devices 102 and 104, and additionally provides write data on the bit lines 116 and 118, the access circuitry asserts the word line 114 along with each other word line of the multiple rows of the memory array. When each of the write word lines of the memory array, such as the word line 114, is asserted, the write operation begins. For example, the pass gates 110 and 112 of bit cell 10 are enabled. Although the write operation has begun, the write operation does not complete while the p-type devices 102 and 104 remain disabled. At a later time, the access circuitry returns VDD 140 from a voltage level less than the transistor threshold voltage to a voltage level above the transistor threshold voltage. The write operation is able to complete without the p-type devices 102 and 104 contending with the external write driver of the access circuitry. In various implementations, each bit cell of the at least one column of the multiple columns that includes bit cell 100 concurrently completes the write operation without contention from the p-type devices. Therefore, both the latency and the power consumption of the write operation during reset reduces. When the write operation completes, which ends the reset operation, the access circuitry reverses the above steps to prepare the memory array for generated access requests from the processing unit.

Figure 2:
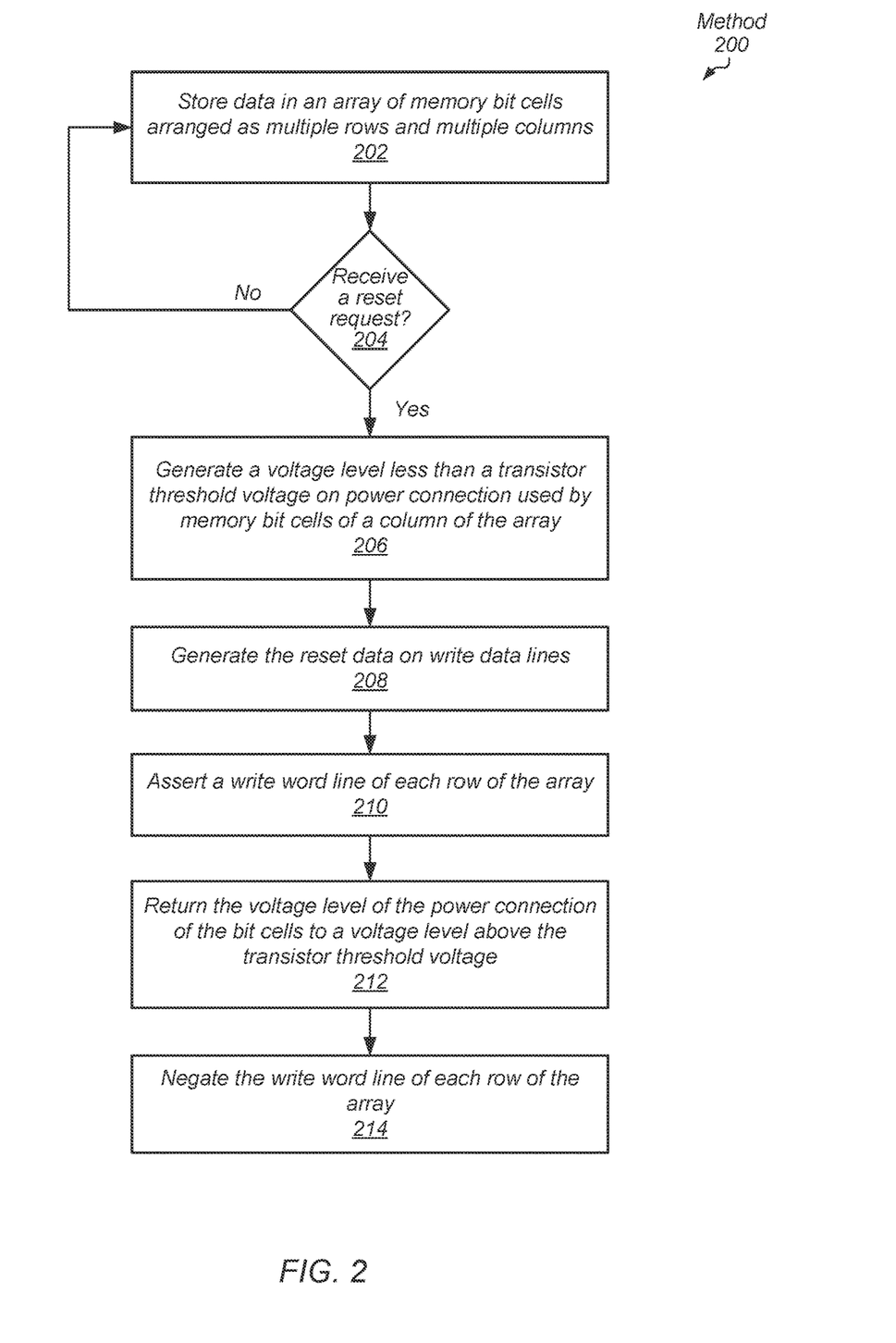
FIG. 2 is a generalized diagram of a method for efficiently resetting data stored in a memory array.

Referring to FIG. 2, a generalized diagram is shown of a method 200 for efficiently resetting data stored in a memory array. For purposes of discussion, the steps in this implementation (as well as in FIGS. 4-5 and 7) are shown in sequential order. However, in other implementations some steps occur in a different order than shown, some steps are performed concurrently, some steps are combined with other steps, and some steps are absent.

An array of memory bit cells stores data, and the array is arranged as multiple rows and columns (block 202). In various implementations, the values of the stored data are maintained by data storage loops within the memory bit cells. In addition, the values of the stored data are updated by write operations. In some implementations, the memory bit cells include pass gates and feedback inverters (and feedback tristate inverters) to implement data storage loops and allow updating of the stored values during the write operations. For example, each bit cell uses a variation of the six-transistor (6T) static random access memory (SRAM) cell. In some implementations, the memory bit cells use the pass gates and feedback inverters of memory bit cell 100 (of FIG. 1).

If the memory array access circuitry (or access circuitry) determines that a reset request is not received ("no" branch of the conditional block 204), then control flow of method 200 returns to block 202 where the array continues to store data. However, if the access circuitry determines that a reset request is received ("yes" branch of the conditional block 204), then the access circuitry generates a voltage level that is less than a threshold voltage of transistors on a power supply connection used by memory bit cells of a column of the array (block 206). By doing so, the p-type devices in the bit cells become disabled.

The access circuitry generates the reset data on write data lines (block 208). In an implementation, the reset data includes an invalid bit to use to invalidate cache lines. Following, the access circuitry asserts a write word line of each row of the array (block 210). Typically, the access circuitry asserts a single write word line during a write operation and continues to provide a voltage level on the power connection of bit cells that is greater than a transistor threshold voltage level. However, for a reset operation, the access circuitry asserts each write word line during the write operation and provides a voltage level on the power connection of bit cells that is less than a transistor threshold voltage level.

When each of the write word lines of the memory array is asserted, the write operation begins. For example, the pass gates of each bit cell in a particular column are enabled. Although the write operation has begun, the write operation does not complete while the p-type devices of the bit cells remain disabled. At a later time, the access circuitry returns the voltage level on the power connection of the bit cells from a voltage level less than the transistor threshold voltage to a voltage level above the transistor threshold voltage (block 212). The write operation is able to complete without the p-type devices of the bit cell contending with the external write driver of the access circuitry. Therefore, both the latency and the power consumption of the write operation during reset reduces. When the write operation completes, which ends the reset operation, the access circuitry reverses the above steps to prepare the memory array for generated access requests from the processing unit. For example, the access circuitry negates the write word line of each row of the array (block 214).

Figure 3:
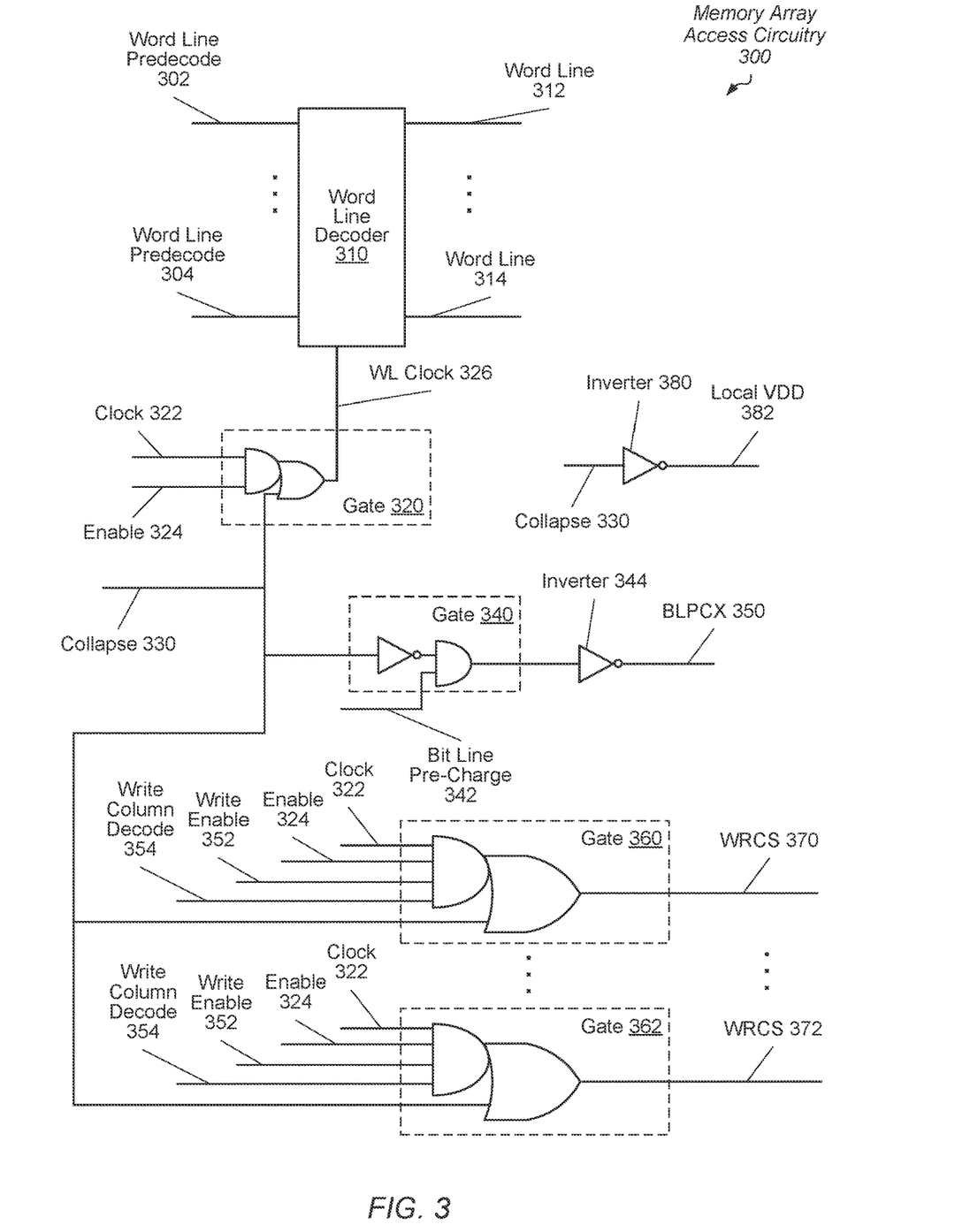
FIG. 3 is a generalized diagram of a memory array access circuitry.

Turning now to FIG. 3, a generalized block diagram is shown of a memory array access circuitry 300. As shown, the memory array access circuitry 300 (or access circuitry 300) includes a word line decoder 310 and multiple Boolean complex gates 320, 340 and 360-362. In some implementations, an entire external memory array uses the output signals of access circuitry 300. In other implementations, the memory is partitioned into multiple memory banks, and a particular memory bank uses the output signals of access circuitry 300.

The access circuitry receives an asserted value on the control signal collapse 330 when a reset operation is occurring. In an implementation, the collapse signal 330 is used to generate the voltage level that is less than a transistor threshold voltage used by the p-type devices of the memory bit cells. In some implementations, this voltage level is the ground reference voltage level. For example, in an implementation, the collapse signal 330 is asserted with a Boolean high value when a reset operation begins, and the inverter 380 generates the local VDD signal 382 as a Boolean low value. The local VDD signal 382 is conveyed to the p-type devices of each memory bit cell in a particular column of the memory array.

The word line decoder 310 receives word line predecode signals 302-304. The number of signals 302-304 is equal to the number of rows in the memory array or memory bank that uses the access circuitry 300. During a typical write operation, a write request address is used to determine which one of the rows of the memory array (or memory bank) is being selected. One of the word line predecode signals 302-304 is asserted based on the write request address. The word line decoder 310 also receives the word line (WL) clock signal 326, which is generated by the Boolean complex gate 320 (or gate 320).

The gate 320 receives a clock signal 322 and an enable signal. In some implementations, the enable signal 324 indicates a particular memory bank is being written. The gate 320 also receives the collapse signal 330. Therefore, based on the gate 320 and its Boolean OR functionality, during a reset operation, the collapse signal 330 overrides the clock signal 332 and the enable signal 324. In an implementation, during a reset operation, an external predecoder assets each of the word line predecode signals 302-304. Therefore, due to the collapse signal 330 causing the WL clock signal 326 to be asserted, each of the word lines 312-314 becomes asserted. In another implementation, the word line decoder 310 directly receives the collapse signal 330, and as a result, when the collapse signal 330 is asserted, the word line decoder 310 asserts each of the word lines 312-314.

The Boolean complex gate 340 (or gate 340) and the inverter 344 generate the BLPCX signal 350, which is used as a bit line pre-charge signal by p-type devices of the memory array. These external p-type devices perform a pre-charge operation on bit lines of a particular column of the memory array. The gate 340 receives the bit line pre-charge signal 342 from a previous stage of control circuitry that determines when to enable and disable pre-charging for a write operation. However, the Boolean logic of the gate 340 allows the collapse signal 330 to override this bit line pre-charge signal 342. When the collapse signal 330 is asserted with a Boolean logic high level, the inverter 344 generates the BLPCX 350 signal as a Boolean high level, which disables the p-type devices of the bit line pre-charge circuitry of the particular column of the memory array.

The Boolean complex gates 360-362 are replications of a same complex gate. The access circuitry 300 includes a same number of Boolean complex gates 360-362 (or complex gates 360-362) as a number of columns used for a same type of data stored in the memory array. For example, if in place of using 1,024 rows, the memory array instead uses 256 rows with the data arranged in a horizontal manner such that 4 columns are used. Therefore, four column select lines are used. Such an arrangement reduces the capacitive loading on a bit line. In addition, multiple columns of the memory array are able to share a single write driver and a single sense amplifier of the memory array.

In an implementation, the complex gates 360 receives the clock signal 322, the enable signal 324, a write enable signal 352, and a write column decode signal 354 that is an output of a decoder that selects which one of multiple columns is being updated. The gate 362 receives the same input signals. However, during a reset operation, the asserted collapse signal 330 causes each of the gates 360-362 to bypass these other input signals and generate asserted values for the output signals WRCS 370-372. These output signals WRCS 370-372 are used as write column select lines by the external memory array.

Figure 4:
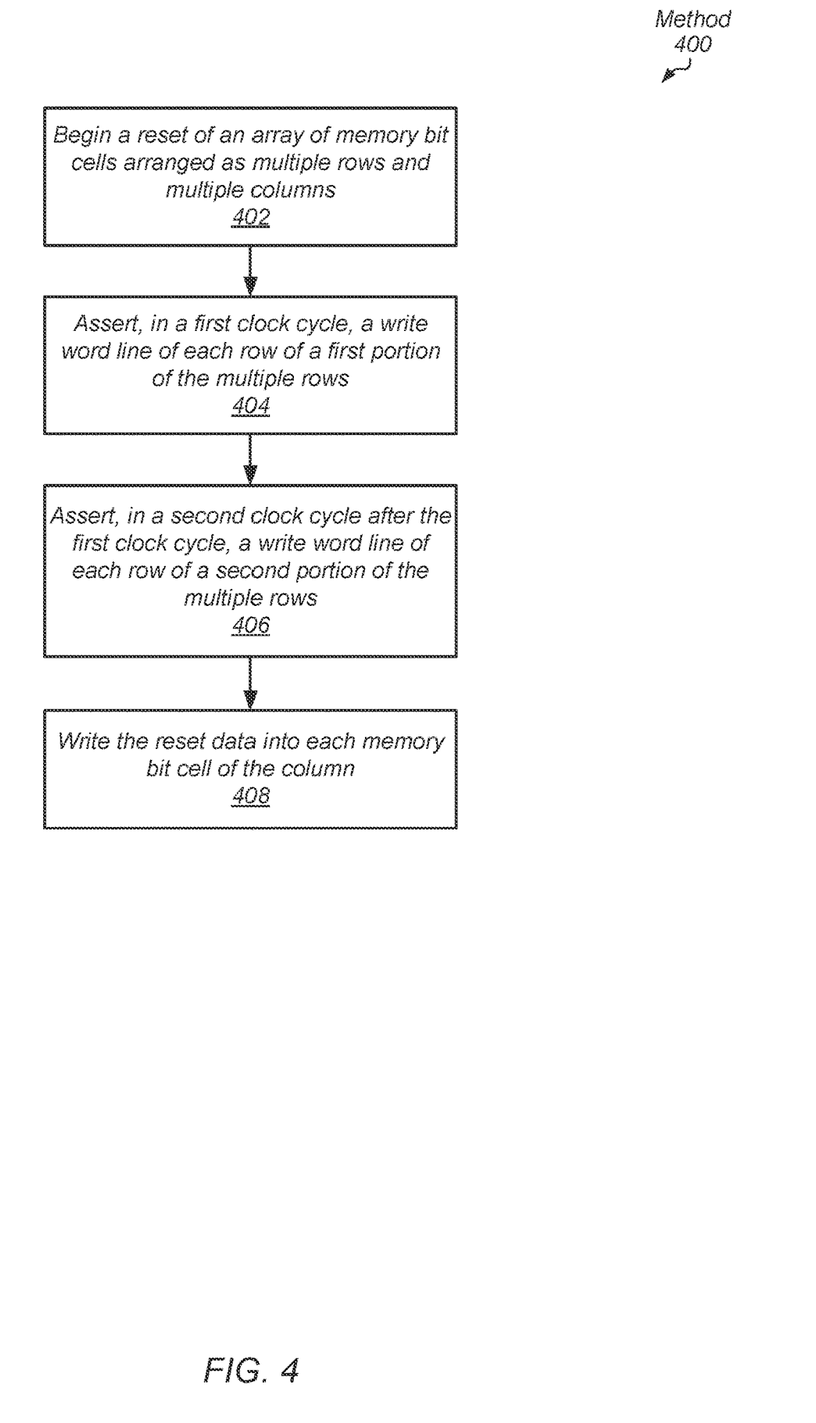
FIG. 4 is a generalized diagram of a method for efficiently resetting data stored in a memory array.

Referring now to FIG. 4, a generalized diagram is shown of a method 400 for efficiently resetting data stored in a memory array. The access circuitry begins a reset of an array of memory bit cells arranged as multiple rows and multiple columns (block 402). The access circuitry asserts, in a first clock cycle, a write word line of each row of a first portion of the multiple rows (block 404). In various implementations, the access circuitry has already performed steps described earlier directed toward blocks 206 and 208 of the method 200 (of FIG. 2). For example, the access circuitry has already reduced the voltage level received by the p-type devices of bit cells of a particular column of the memory array. For example, the access circuitry has reduced this voltage level to be less than a transistor threshold voltage level. Additionally, the access circuitry has already generated the reset data on the write bit lines.

The access circuitry asserts, in a second clock cycle after the first clock cycle, a write word line of each row of a second portion of the multiple rows (block 406). Therefore, the access circuitry asserts the write word lines in stages in order to reduce voltage droop caused by the simultaneous switching of a wide bus. The voltage droop is proportional to the expression L di/dt, wherein L is the parasitic inductance and di/dt is the time rate of change of the current consumption. In an implementation, the access circuitry divides the memory array into two portions, and asserts half of the total number of word lines in the first clock cycle and asserts the other half of the total number of words lines in the second clock cycle. In such an implementation, the access circuitry uses two clock cycles to assert each of the word lines of the memory array during a reset operation. The access circuitry writes the reset data into each memory bit cell of the column (block 408). For example, the access circuitry performs the steps described earlier directed toward blocks 210-214 of the method 200 (of FIG. 2).

In another implementation, the access circuitry asserts one quarter of the total number of word lines in the first clock cycle, and asserts another quarter of the total number of words lines in the second clock cycle. In such an implementation, the access circuitry uses four clock cycles to assert each of the word lines of the memory array during a reset operation. However, using a prior mechanism for performing the reset operation, the access circuitry would update a single row per clock cycle. For example, the prior mechanism didn't reduce the power supply voltage used by the p-type devices of the bit cells. Therefore, the p-type devices contend with the write driver during a write operation during reset. Updating a large number of rows concurrently causes the write drivers of the access circuitry to increase significantly in size. Therefore, there are costs with increased power consumption and increased on-die area. Therefore, the prior mechanism updated one row per clock cycle. For a memory array with 1,024 entries, the reset operation requires 1,024 clock cycles. However, using the steps described in at least methods 200 and 400 (of FIGS. 200 and 400), the reset operation requires only 2, 4, or 8 clock cycles. Each of latency and on-die area of components, such as the write driver, reduces.

Figure 5:
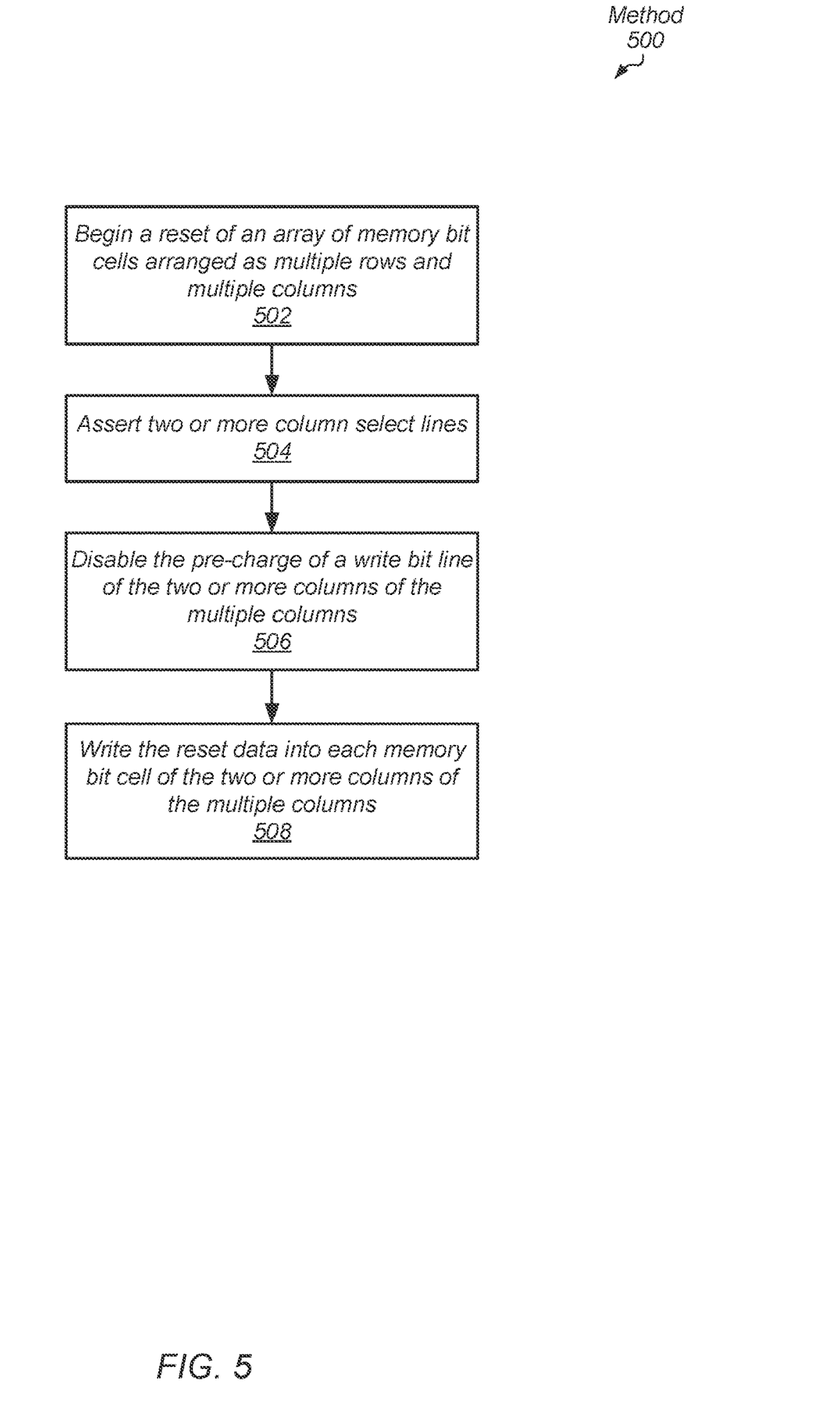
FIG. 5 is a generalized diagram of a method for efficiently resetting data stored in a memory array.

Referring now to FIG. 5, a generalized diagram is shown of a method 500 for efficiently resetting data stored in multiple memory bit cells in a column of a memory array. The access circuitry begins a reset of an array of memory bit cells arranged as multiple rows and multiple columns (block 502). The access circuitry asserts two or more column select lines (block 504). As described earlier, in place of using 1,024 rows, in some designs, the memory array instead uses 256 rows with the data arranged in a horizontal manner such that 4 columns are used. Therefore, four column select lines are used. Such an arrangement reduces the capacitive loading on a bit line. In addition, multiple columns of the memory array are able to share a single write driver and a single sense amplifier of the memory array. In such a design, typically, a single column select line is asserted during a write operation. However, here, two or more select lines are asserted during the reset operation. In some implementations, each of the multiple column select lines is asserted.

The access circuitry disables the pre-charge of a write bit line of the two or more columns of the multiple columns (block 506). In addition, the access circuitry disables the pre-charge of a bit line of the two or more columns corresponding to a complementary value of the write bit lines of the two or more columns. Typically, a single bit line and its single corresponding complementary bit line of a single column have their pre-charge circuitry disabled during a write operation in order to place write data on these two bit lines of the single column. However, here, bit lines of two or more columns have corresponding pre-charge circuitry disabled during the reset operation in order to place write data on these bit lines of the two or more columns. In some implementations, the two or more columns includes each column of the multiple columns. The access circuitry writes the reset data into each memory bit cell of the two or more columns with a corresponding column select being asserted (block 508). In various implementations, the access circuitry performs, for the two or more columns of the multiple columns, the steps described earlier directed toward blocks 210-214 of the method 200 (of FIG. 2).

Figure 6:
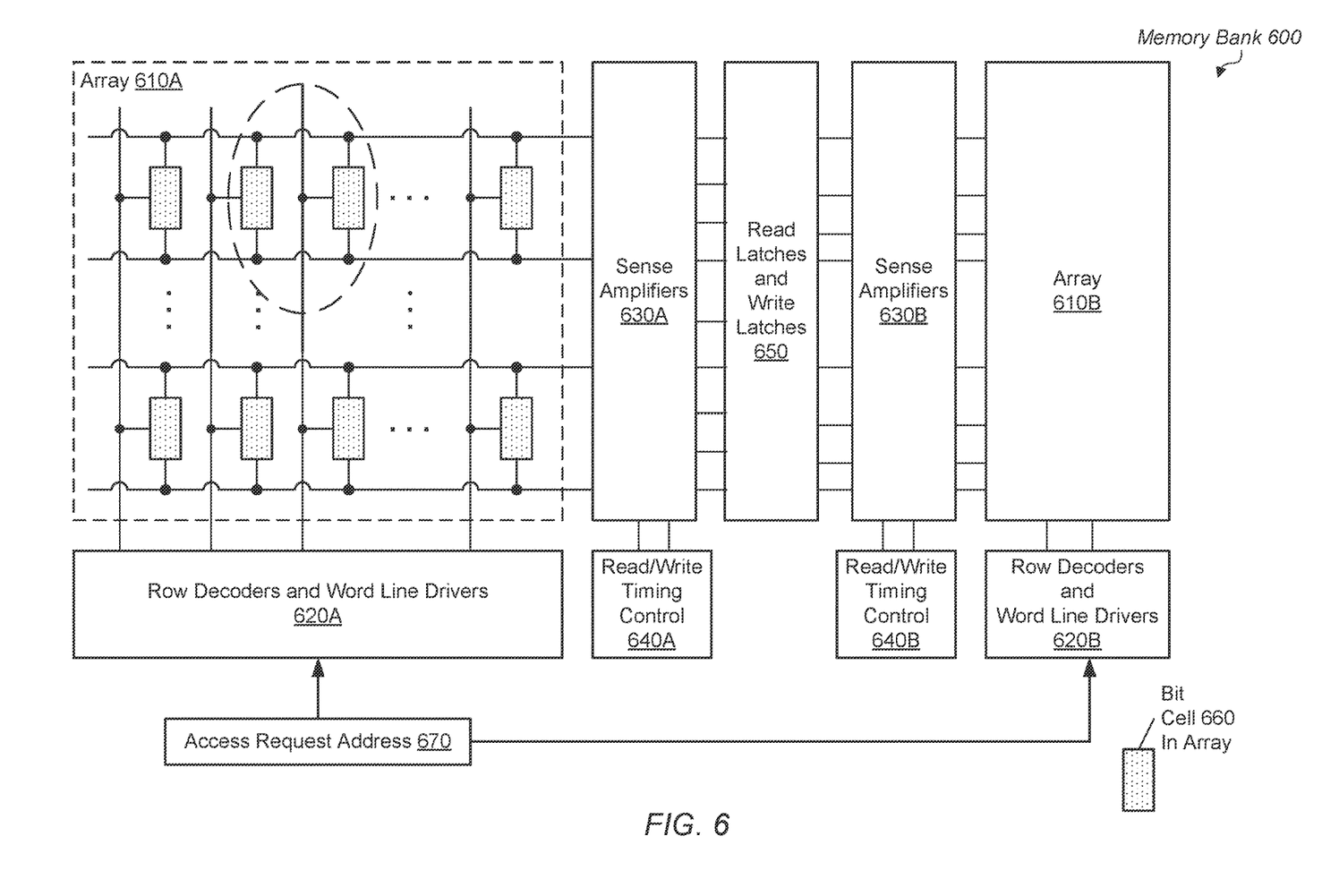
FIG. 6 is a generalized diagram of a memory bank.

Turning now to FIG. 6, a generalized block diagram is shown of a memory bank 600. In various implementations, a memory is organized as multiple memory banks, and a memory macro block includes both a left bank and a right bank. In some implementations, the bank 600 is one of the left bank or the right bank of the memory macro block. Although "left" and "right" are used to describe the memory banks, other notations can be used such as a "top bank" and a "bottom bank." As shown, the memory bank 600 includes arrays 610A-610B, row decoders 620A-620B, sense amplifiers 630A-630B between the arrays 610A-610B, read and write timing control logic 640A-640B, and read latches and write latches in block 650. It is noted that, in some implementations, multiple banks are accessed concurrently in a same clock cycle or a same pipeline stage. The access includes one of a read access and a write access. In such implementations, bank address decoders select the corresponding banks to access.

In various implementations, each of the blocks 610A-610B, 620A-620B, 630A-630B, 640A-640B and 650 in the memory bank 600 is communicatively coupled to another one of the blocks. For example, direct connections are used wherein routing occurs through another block. Alternatively, staging of signals is done in an intermediate block. In various implementations, each of the arrays 610A-610B includes multiple memory bit cells 660 arranged in a tiled format. In various implementations, the bit cell 660 includes the circuitry of bit cell 100 (of FIG. 1). Here, the rows are aligned with the tracks used for the routing of the word lines of the array such as in the vertical direction in the illustrated implementation. The columns are aligned with the tracks used for the routing of the bit lines of the array such as in the horizontal direction in the illustrated implementation.

The row decoders and word line drivers in blocks 620A-620B receive address information corresponding to an access request. For example, each of the blocks 620A-620B receives the information provided by the access request address 670. Each one of the blocks 620A-620B selects a particular row, or entry, of the multiple rows in an associated one of the arrays 620A-620B. In some implementations, the blocks 620A-620B use an index portion of the address 670 for selecting a given row, or entry, in an associated one of the arrays 620A-620B. Each row, or entry, stores one or more memory lines.

In the implementation shown, the rows, or entries, in the arrays 620A-620B are arranged in a vertical orientation. However, in other implementations, a horizontal orientation is used for storage of the memory lines. For write access requests, the write latches are located in block 650. The write data is driven into the arrays 610A-610B. The timing control circuitry 640A-640B updates the write latches with new data in block 650 and sets up the write word line driver logic. The write data is written into a row of bit cells that is selected by an associated one of the blocks 620A-620B. In some implementations, pre-charge circuitry is included in block 650.

For read access requests, the block 650 is used to precharge the read bit lines routed to the arrays 610A-610B. The timing circuitry in blocks 640A-640B is used for pre-charging and setting up the sense amplifiers in the blocks 630A-630B. The timing circuitry 640A-640B sets up the read word line driver logic. One of the row decoders 620A-620B selects a row to read out data, which will be provided on read bit lines that are sensed by the sense amplifiers. The read latches capture the read data.

In various implementations, the row decoders and word line drivers 620A-620B and the column select control circuitry in one of the blocks 630A-630B and 650 utilize the functionality of the access circuitry 300 (of FIG. 3), and performs steps described earlier regarding the bit cell 100 (of FIG. 1) and the access circuitry 300 (of FIG. 3). In other words, the access circuitry shown surrounding the arrays 610A-610B utilize the collapse control signal that is asserted during a reset operation. Therefore, the access circuitry shown surrounding the arrays 610A-610B is able to generate a power supply voltage level less than the transistor threshold voltage and send it to the power connection of each bit cell in a particular column. Additionally, the access circuitry shown surrounding the arrays 610A-610B is able to assert each of the words lines during the reset operation. Further, this access circuitry of the memory bank 600 is capable of asserting multiple word lines in groups over multiple clock cycles. Therefore, this access circuitry of the memory bank 600 completes the reset operation without the p-type devices of bit cells contending with the write driver. The power consumption reduces and the on-die area of the word drivers also reduces.

Figure 7:
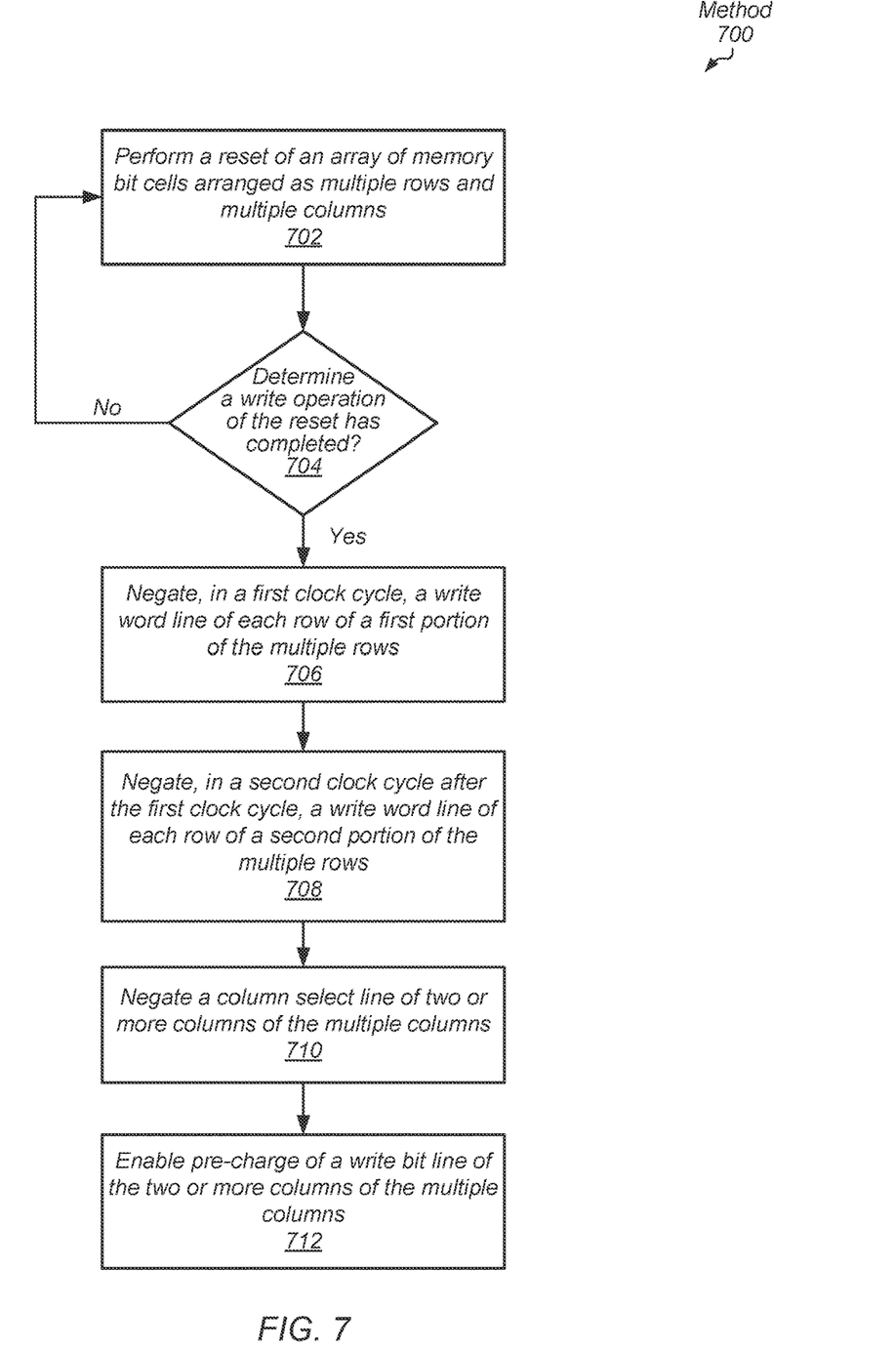
FIG. 7 is a generalized diagram of a method for efficiently resetting data stored in a memory array.

Referring now to FIG. 7, a generalized diagram is shown of a method 700 for efficiently resetting data stored in a memory array. The access circuitry performs a reset of an array of memory bit cells arranged as multiple rows and multiple columns (block 702). If the access circuitry determines that a write operation of the requested reset has not yet completed ("no" branch of the conditional block 704), then control flow of method 700 returns to block 702 where the reset operation continues. However, if the access circuitry determines that a write operation of the requested reset has completed ("yes" branch of the conditional block 704), then the access circuitry negates, in a first clock cycle, a write word line of each row of a first portion of the multiple rows (block 706).

The access circuitry negates, in a second clock cycle after the first clock cycle, a write word line of each row of a second portion of the multiple rows (block 708). The access circuitry negates a column select line of two or more columns of the multiple columns (block 710). The access circuitry enables pre-charge of a write bit line of the two or more columns of the multiple columns (block 712).

Figure 8:
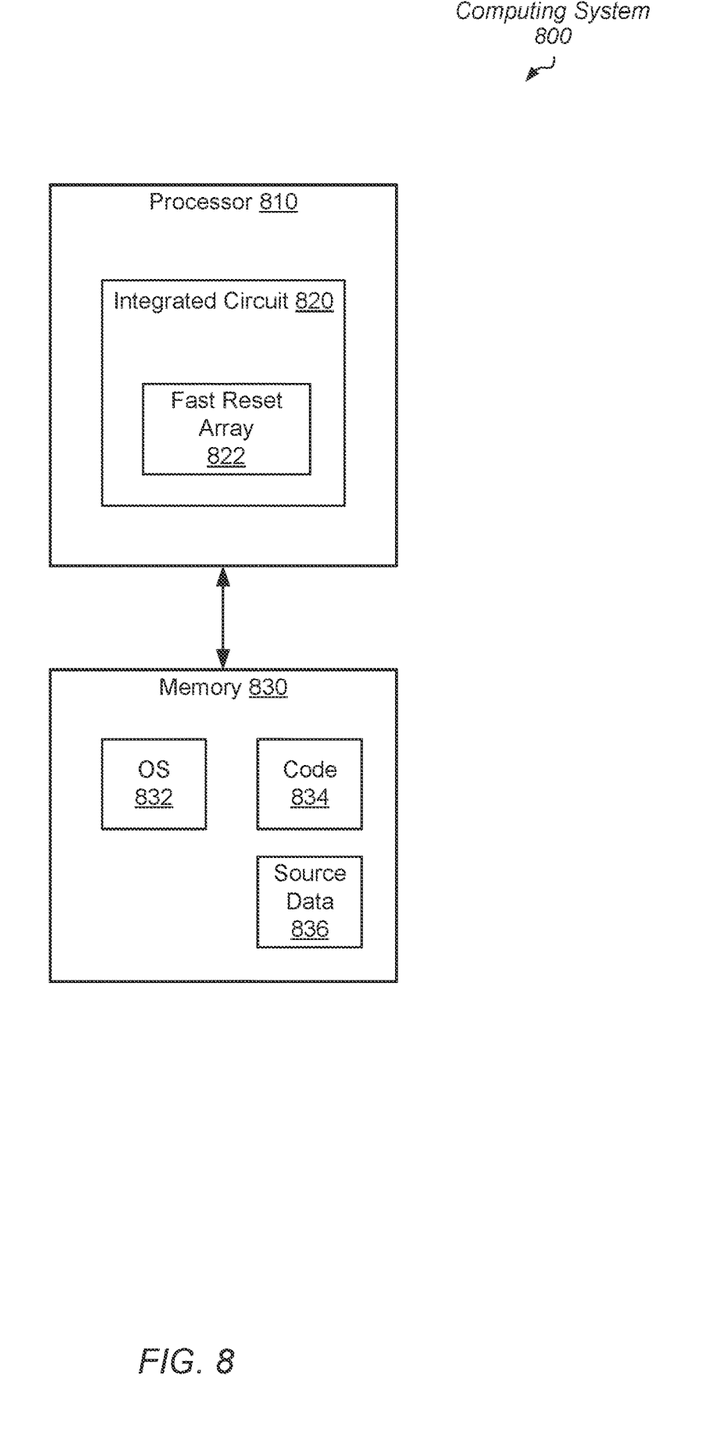
FIG. 8 is a generalized diagram of a computing system.

Referring to FIG. 8, one implementation of a computing system 800 is shown. The computing system 800 includes the processor 810 and the memory 830. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 800 includes one or more of other processors of a same type or a different type than processor 810, one or more peripheral devices, a network interface, one or more other memory devices, and so forth. In some implementations, the functionality of the computing system 800 is incorporated on a system on chip (SoC). In other implementations, the functionality of the computing system 800 is incorporated on a peripheral card inserted in a motherboard. The computing system 800 is used in any of a variety of computing devices such as a server computer, a desktop computer, a tablet computer, a laptop, a smartphone, a smartwatch, a gaming console, a personal assistant device, and so forth.

The processor 810 includes hardware such as circuitry. For example, the processor 810 includes at least one integrated circuit 820, which utilizes fast reset array 822. The integrated circuit 820 uses the fast reset array 822 for data storage of a variety of type of data. In various implementations, the fast reset array 822 uses memory bit cells is arranged as multiple rows and columns. One or more of the processor 810 and the integrated circuit 820 use the fast reset array as a cache at a particular level of the multiple levels of a cache memory subsystem. In some implementations, the fast reset array 822 uses one or more of the circuitry described earlier for the bit cell 100 (of FIG. 1), the access circuitry 300 (of FIG. 3), and the memory bank 600 (of FIG. 6).

In various implementations, the processor 810 includes one or more processing units. In some implementations, each of the processing units includes one or more processor cores capable of general-purpose data processing, and an associated cache memory subsystem. In such an implementation, the processor 810 is a central processing unit (CPU). In another implementation, the processing cores are compute units, each with a highly parallel data microarchitecture with multiple parallel execution lanes and an associated data storage buffer. In such an implementation, the processor 810 is a graphics processing unit (GPU), a digital signal processor (DSP), or other.

In some implementations, the memory 830 includes one or more of a hard disk drive, a solid-state disk, other types of flash memory, a portable solid-state drive, a tape drive and so on. The memory 830 stores an operating system (OS) 832, one or more applications represented by code 834, and at least source data 836. Memory 830 is also capable of storing intermediate result data and final result data generated by the processor 810 when executing a particular application of code 834. Although a single operating system 832 and a single instance of code 834 and source data 836 are shown, in other implementations, another number of these software components are stored in memory 830. The operating system 832 includes instructions for initiating the boot up of the processor 810, assigning tasks to hardware circuitry, managing resources of the computing system 800 and hosting one or more virtual environments.

Each of the processor 810 and the memory 830 includes an interface unit for communicating with one another as well as any other hardware components included in the computing system 800. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   an array of memory bit cells for storing data arranged as a plurality of rows and a plurality of columns;
   access circuitry configured to:
      generate a power supply reference voltage level of the array on a power supply connection used by memory bit cells of one or more columns of the plurality of the columns; and
      in response to receiving a reset request:
         generate, on the power supply connection, a given voltage level that is less than a threshold voltage of transistors used in the memory bit cell; and
         assert a write word line of each row of the plurality of rows.

2. The integrated circuit as recited in claim 1, wherein the given voltage level is a ground reference voltage level.

3. The integrated circuit as recited in claim 1, wherein to assert a write word line of each row of the plurality of rows, the access circuitry is further configured to:
   assert, in a first clock cycle, the word line of each row of a first portion of the plurality of rows; and assert, in a second clock cycle after the first clock cycle, the word line of each row of a second portion of the plurality of rows.

4. The integrated circuit as recited in claim 1, wherein the access circuitry is further configured to assert a column select line of two or more columns of the plurality of columns.

5. The integrated circuit as recited in claim 1, wherein in response to determining a write bit line stores reset data, the access circuitry is further configured to:
generate the power supply reference voltage level of the array on the power supply connection used by memory bit cells of the one or more columns of the plurality of the columns.

6. The integrated circuit as recited in claim 5, wherein in response to determining a write operation has completed, the access circuitry is further configured to negate the write word line of each row of the plurality of rows.

7. The integrated circuit as recited in claim 6, wherein to negate the write word line of each row of the plurality of rows, the access circuitry is further configured to:
negate, in a third clock cycle, the word line of each row of a first portion of the plurality of rows; and
negate, in a fourth clock cycle after the third clock cycle, the word line of each row of a second portion of the plurality of rows.

8. A method comprising:
storing data in an array of memory bit cells arranged as a plurality of rows and a plurality of columns;
generating, by access circuitry of the array, a power supply reference voltage level of the array on a power supply connection used by memory bit cells of one or more columns of the plurality of the columns;
in response to receiving a reset request:
generating, on the power supply connection by the access circuitry, a given voltage level that is less than a threshold voltage of transistors used in the memory bit cell; and
asserting, by the access circuitry, a write word line of each row of the plurality of rows.

9. The method as recited in claim 8, wherein the given voltage level is a ground reference voltage level.

10. The method as recited in claim 8, wherein to assert a write word line of each row of the plurality of rows, the method further comprises:
asserting, by the access circuitry in a first clock cycle, the word line of each row of a first portion of the plurality of rows; and
asserting, by the access circuitry in a second clock cycle after the first clock cycle, the word line of each row of a second portion of the plurality of rows.

11. The method as recited in claim 8, further comprising asserting, by the access circuitry, a column select line of two or more columns of the plurality of columns.

12. The method as recited in claim 8, wherein in response to determining a write bit line stores reset data, the method further comprises:
generating, by the access circuitry, the power supply reference voltage level of the array on the power supply connection used by memory bit cells of the one or more columns of the plurality of the columns.

13. The method as recited in claim 12, wherein in response to determining a write operation has completed, the method further comprises negating, by the access circuitry, the write word line of each row of the plurality of rows.

14. The method as recited in claim 13, wherein to negate the write word line of each row of the plurality of rows, the method further comprises:
negating, by the access circuitry in a third clock cycle, the word line of each row of a first portion of the plurality of rows; and
negating, by the access circuitry in a fourth clock cycle after the third clock cycle, the word line of each row of a second portion of the plurality of rows.

15. A computing system comprising:
a memory configured to store instructions of one or more tasks and source data to be processed by the one or more tasks;
an integrated circuit configured to execute the instructions using the source data,
wherein the integrated circuit comprises:
access circuitry; and
an array of memory bit cells for storing data arranged as a plurality of rows and a plurality of columns;
wherein the access circuitry is configured to:
generate a power supply reference voltage level of the array on a power supply connection used by memory bit cells of one or more columns of the plurality of the columns;
in response to receiving a reset request:
generate, on the power supply connection, a given voltage level that is less than a threshold voltage of transistors used in the memory bit cell; and
assert a write word line of each row of the plurality of rows.

16. The computing system as recited in claim 15, wherein the given voltage level is a ground reference voltage level.

17. The computing system as recited in claim 15, wherein to assert a write word line of each row of the plurality of rows, the access circuitry is further configured to:
assert, in a first clock cycle, the word line of each row of a first portion of the plurality of rows; and
assert, in a second clock cycle after the first clock cycle, the word line of each row of a second portion of the plurality of rows.

18. The computing system as recited in claim 15, wherein the access circuitry is further configured to assert a column select line of two or more columns of the plurality of columns.

19. The computing system as recited in claim 15, wherein in response to determining a write bit line stores reset data, the access circuitry is further configured to:
generate the power supply reference voltage level of the array on the power supply connection used by memory bit cells of the one or more columns of the plurality of the columns.

20. The computing system as recited in claim 19, wherein in response to determining a write operation has completed, the access circuitry is further configured to negate the write word line of each row of the plurality of rows.

\* \* \* \* \*